US012784864B2

(12) United States Patent
Frans et al.

(10) Patent No.: US 12,784,864 B2
(45) **Date of Patent: *Nov. 3, 2026**

(54) TIMING-DRIFT CALIBRATION

(71) Applicant: Rambus Inc., San Jose, CA (US)

(72) Inventors: Yohan U. Frans, Palo Alto, CA (US); Wayne F. Ellis, Jericho Center, VT (US); Akash Bansal, Santa Clara, CA (US)

(73) Assignee: Rambus Inc., San Jose, CA (US)

( * ) Notice: Subject to any disclaimer, the term of this patent is extended or adjusted under 35 U.S.C. 154(b) by 130 days.

This patent is subject to a terminal disclaimer.

(21) Appl. No.: 18/809,250

(22) Filed: Aug. 19, 2024

(65) Prior Publication Data

US 2025/0054561 A1 Feb. 13, 2025

Related U.S. Application Data

(60) Division of application No. 17/556,363, filed on Dec. 20, 2021, now Pat. No. 12,094,553, which is a (Continued)

(51) Int. Cl.

| | |
|---|---|
| ***G11C 8/18*** | (2006.01) |
| ***G01R 23/02*** | (2006.01) |
| ***G06F 13/16*** | (2006.01) |
| ***G11C 7/22*** | (2006.01) |
| ***G11C 29/02*** | (2006.01) |
| ***G11C 29/50*** | (2006.01) |

(Continued)

(52) U.S. Cl.

CPC ........ *G11C 29/50012* (2013.01); *G01R 23/02* (2013.01); *G06F 13/1689* (2013.01); *G11C 7/22* (2013.01); *G11C 7/222* (2013.01); *G11C 7/225* (2013.01); *G11C 8/18* (2013.01); *G11C 29/023* (2013.01); *G11C 29/028* (2013.01); *H03L 1/02* (2013.01); *G01R 23/15* (2013.01); *G01R 35/005* (2013.01); *G06F 1/08* (2013.01); *G06F 1/12* (2013.01); *G06F 11/1604* (2013.01); *G11C 7/04* (2013.01); *G11C 2207/2254* (2013.01)

(58) Field of Classification Search

CPC ................................................ G11C 29/20012

See application file for complete search history.

(56) References Cited

U.S. PATENT DOCUMENTS 4,123,704 A 10/1978 Johnson
5,784,332 A 7/1998 Zheng et al.
(Continued)

OTHER PUBLICATIONS

PCT International Search Report and Written Opinion dated Jun. 28, 2012 in International Application No. PCT/US2011/060213. 9 pages.

*Primary Examiner* — Jason Lappas
(74) *Attorney, Agent, or Firm* — Lowenstein Sandler LLP

(57) ABSTRACT

The disclosed embodiments relate to components of a memory system that support timing-drift calibration. In specific embodiments, this memory system contains a memory device (or multiple devices) which includes a clock distribution circuit and an oscillator circuit which can generate a frequency, wherein a change in the frequency is indicative of a timing drift of the clock distribution circuit. The memory device also includes a measurement circuit which is configured to measure the frequency of the oscillator circuit.

20 Claims, 6 Drawing Sheets

Related U.S. Application Data continuation of application No. 16/824,005, filed on Mar. 19, 2020, now Pat. No. 11,211,139, which is a continuation of application No. 15/847,559, filed on Dec. 19, 2017, now Pat. No. 10,600,497, which is a continuation of application No. 14/884,601, filed on Oct. 15, 2015, now Pat. No. 9,859,021, which is a division of application No. 13/884,248, filed as application No. PCT/US2011/060213 on Nov. 10, 2011, now Pat. No. 9,401,225.

(60) Provisional application No. 61/415,583, filed on Nov. 19, 2010.

(51) Int. Cl.

| | |
|---|---|
| ***H03L 1/02*** | (2006.01) |
| *G01R 23/15* | (2006.01) |
| *G01R 35/00* | (2006.01) |
| *G06F 1/08* | (2006.01) |
| *G06F 1/12* | (2006.01) |
| *G06F 11/16* | (2006.01) |
| *G11C 7/04* | (2006.01) |

(56) References Cited

U.S. PATENT DOCUMENTS

| | | | | |
|---|---|---|---|---|
| 5,867,438 | A | 2/1999 | Nomura et al. | |
| 6,011,749 | A | 1/2000 | Roth et al. | |
| 6,111,812 | A | 8/2000 | Gans et al. | |
| 6,484,232 | B2 | 11/2002 | Olarig et al. | |
| 6,564,288 | B2 | 5/2003 | Olarig et al. | |
| 6,961,862 | B2 | 11/2005 | Best et al. | |
| 7,042,296 | B2 | 5/2006 | Hui et al. | |
| 7,095,789 | B2 | 8/2006 | Ware et al. | |
| 7,187,599 | B2 | 3/2007 | Schnell et al. | |
| 7,242,223 | B1 | 7/2007 | Alon | |
| 7,400,670 | B2 | 7/2008 | Hampel et al. | |
| 7,571,340 | B2 | 8/2009 | Jiang | |
| 8,272,781 | B2 | 9/2012 | Nale | |
| 9,362,006 | B2 | 6/2016 | Frans et al. | |
| 9,401,225 | B2 | 7/2016 | Frans et al. | |
| 9,431,131 | B2 | 8/2016 | Frans et al. | |
| 10,600,497 | B2 * | 3/2020 | Frans ....................... | G11C 8/18 |
| 2003/0043673 | A1 | 3/2003 | Hashimoto et al. | |
| 2003/0154416 | A1 | 8/2003 | LaBerge | |
| 2004/0041606 | A1 | 3/2004 | Kirsch | |
| 2004/0062121 | A1 | 4/2004 | Chung et al. | |
| 2004/0062138 | A1 | 4/2004 | Partsch et al. | |
| 2005/0082664 | A1 | 4/2005 | Funaba et al. | |
| 2005/0187724 | A1 | 8/2005 | Kim et al. | |
| 2005/0213400 | A1 | 9/2005 | Kim et al. | |
| 2005/0270890 | A1 | 12/2005 | Kim | |
| 2006/0041730 | A1 | 2/2006 | Larson | |
| 2006/0080575 | A1 | 4/2006 | Golparian | |
| 2006/0152260 | A1 | 7/2006 | Chung | |
| 2007/0247935 | A1 | 10/2007 | Ware et al. | |
| 2007/0280007 | A1 | 12/2007 | Wallner et al. | |
| 2008/0111637 | A1 | 5/2008 | Sunwoo et al. | |
| 2008/0238490 | A1 | 10/2008 | Park | |
| 2009/0158104 | A1 | 6/2009 | Hsu et al. | |
| 2009/0175116 | A1 | 7/2009 | Song et al. | |
| 2010/0109728 | A1 | 5/2010 | Lefebvre | |
| 2010/0220536 | A1 | 9/2010 | Coteus et al. | |
| 2011/0007576 | A1 | 1/2011 | Kang et al. | |
| 2011/0208990 | A1 | 8/2011 | Zerbe et al. | |
| 2012/0173836 | A1 | 7/2012 | Yermalayeu | |

* cited by examiner

TIMING-DRIFT CALIBRATION

RELATED APPLICATIONS

This application is a divisional of co-pending U.S. application Ser. No. 17/556,363, filed Dec. 20, 2021, which is a continuation of U.S. application Ser. No. 16/824,005, filed Mar. 19, 2020, now U.S. Pat. No. 11,211,139, issued on Dec. 28, 2021, which is a continuation of U.S. application Ser. No. 15/847,559, filed Dec. 19, 2017, now U.S. Pat. No. 10,600,497, issued Mar. 24, 2020, which is a continuation of U.S. application Ser. No. 14/884,601, filed Oct. 15, 2015, now U.S. Pat. No. 9,859,021, issued on Jan. 2, 2018, which is a divisional application of U.S. application Ser. No. 13/884,248, filed Jul. 25, 2013, now U.S. Pat. No. 9,401, 225, issued on Jul. 26, 2016, which is a 371 of PCT Application number PCT/US2011/060213, filed Nov. 10, 2011, which claims the benefit of U.S. Provisional Application No. 61/415,583, filed Nov. 19, 2010, each of which are hereby incorporated by reference in their entirety.

TECHNICAL FIELD

The disclosed embodiments generally relate to integrated circuit devices. More specifically, the present embodiments relate to methods, devices and systems for calibrating timing drift in an integrated circuit device such as a memory device.

BACKGROUND

Integrated circuit devices, for example, integrated circuit devices disposed in memory systems which use power management typically have to deal with a relatively large rate of temperature change (often referred to as "temperature-drift-rate," in degC/ms) due to self-heating when transitioning from a low-power state to an active state and/or self-cooling when transitioning from an active state to a low-power state. This large temperature-drift-rate can cause a significant timing drift over a short period of time, for example, because of the temperature sensitivity of clock distribution circuits (ps/degC) in a memory device.

Furthermore, in multi-rank memory systems, interfaces of the idle ranks are often shut down to save power. When an idle rank is switched back to an active state from an idle state, various signal timings may have changed because of temperature or other environment-induced timing drift during the idle period.

DETAILED DESCRIPTION

The disclosed embodiments relate to components that support timing drift calibration. In specific embodiments, a system is disclosed, which includes an integrated circuit device such as a memory device (or multiple memory devices). The one or more memory devices include a circuit to generate information that can be used to derive a timing drift change. For example, the circuit, in an embodiment, includes an oscillator circuit to measure a frequency (of the oscillator circuit). A relative change in frequency from one frequency value to another may be used to generate a timing parameter update as a result of the timing drift. The memory device is controlled by a memory controller that can transmit a request to the memory device, to trigger the memory device to measure the frequency of the oscillator circuit. In an embodiment, the memory controller receives the measured frequency from the memory device and uses the measured frequency to determine the timing drift update needed for the memory device.

Figure 1:
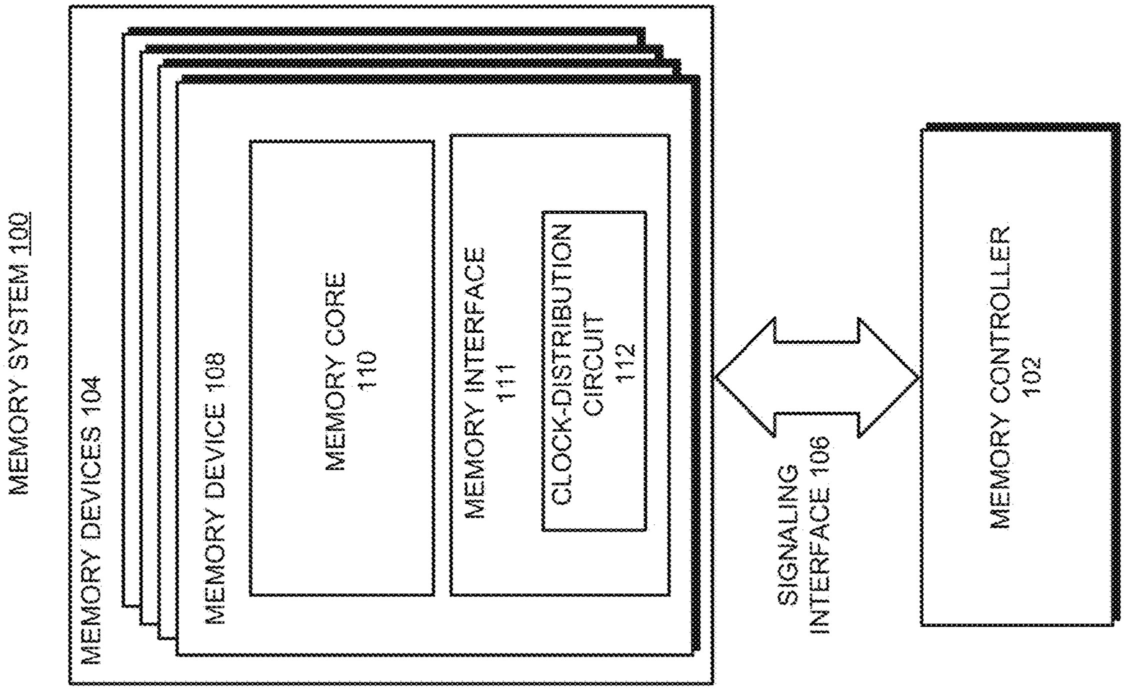
FIG. 1 presents a block diagram illustrating an embodiment of a typical memory system, which includes a controller coupled to a set of memory devices through a signaling interface.

In one embodiment, the memory system includes a memory controller integrated circuit ("IC") chip ("memory controller" or "controller" hereafter) coupled to one or more memory IC chips ("memory components" or "memory devices" hereafter) through a signaling interface. For example, FIG. 1 presents a block diagram illustrating an embodiment of memory system 100, which includes a memory controller 102 coupled to a set of memory devices (such as dynamic random access memory "DRAM" devices) 104 through a signaling interface 106. While FIG. 1 illustrates memory system 100 having one memory controller 102 and four memory devices 104, other embodiments may have additional controllers and/or fewer or more memory devices 104.

A given memory device 108 within memory devices 104 includes a memory core 110 containing a plurality of storage cells and a memory interface 111 providing circuitry to communicate with memory controller 102 through signaling interface 106. Memory interface 111 contains a clock-distribution circuit 112. In an embodiment, there are no PLLs or DLLs in the memory interface 111 shown in FIG. 1. In one embodiment, memory controller 102 and memory devices 104 may be integrated within the same package. In other embodiments, they are implemented in their own respective packages.

Figure 2A:
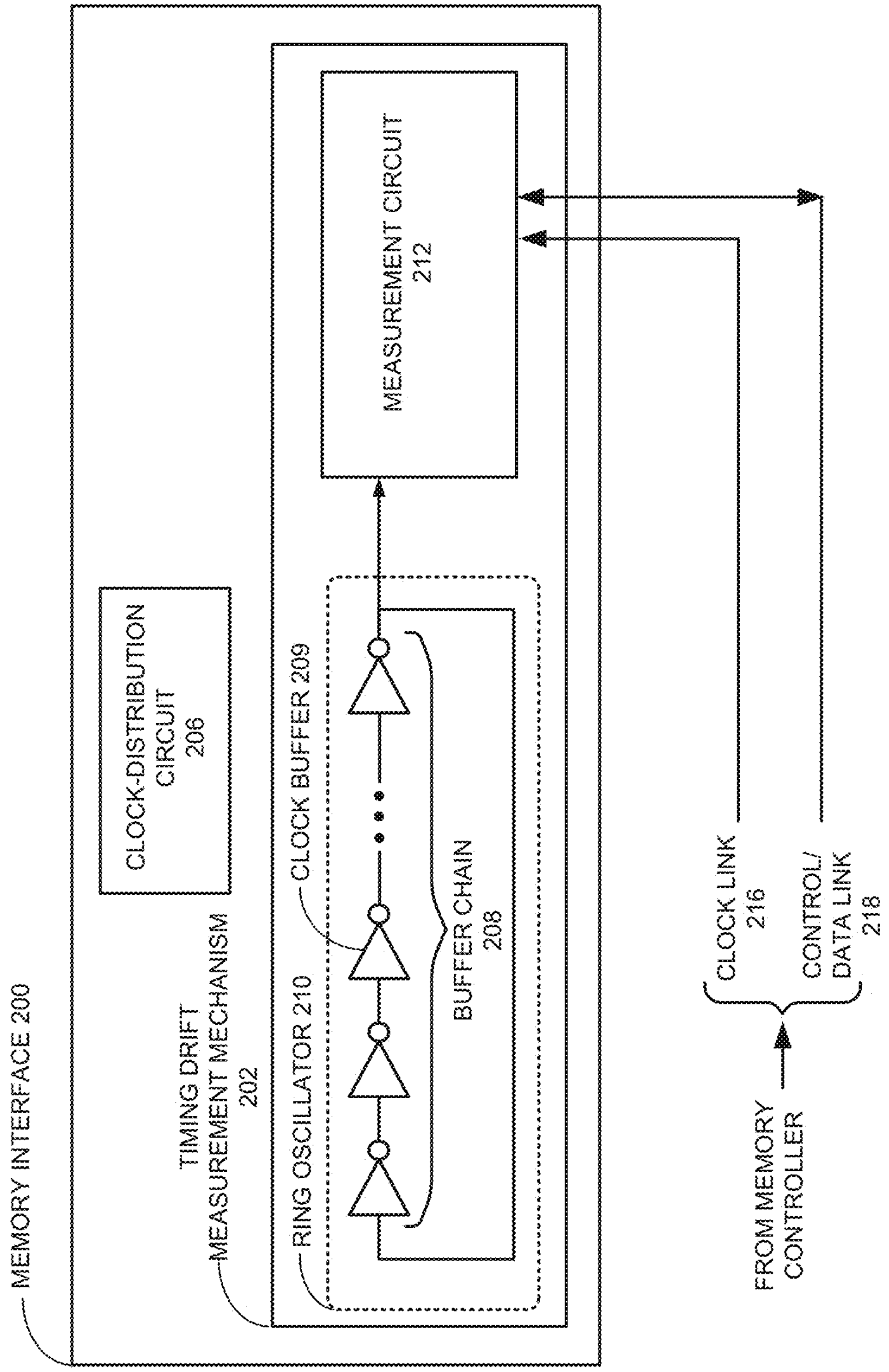
FIG. 2A illustrates a memory device which includes a timing drift measurement mechanism.

FIG. 2A illustrates a memory interface device 200 including a clock distribution circuit 206 and a timing drift measurement mechanism 202. In one embodiment, memory interface 200 is part of a memory device 108 in FIG. 1. For example, memory interface 200 can be memory interface 111. In the illustrated embodiment, a signal frequency indicative of the timing drift can be measured by timing drift measurement mechanism 202 in memory interface 200.

More specifically, timing drift measurement mechanism 202 includes a clock buffer chain 208, which comprises a set of serially coupled clock buffers, such as clock buffer 209. In one embodiment, buffer chain 208 is a replica of a clock path in clock-distribution circuit 206. For example, clock-distribution circuit 206 can have a clock tree structure wherein all clock paths in the clock tree have substantially the same number of clock buffers. Hence, buffer chain 208 can include the same or substantially the same number of clock buffers as one of the clock paths in the clock tree.

As illustrated in FIG. 2A, the output of the last clock buffer in buffer chain 208 is looped back to the input of the first clock buffer in buffer chain 208, thereby forming a ring oscillator 210. As mentioned above, buffer chain 208 in ring oscillator 210 is a replica of a clock path in clock-distribution circuit 206. Note that while ring oscillator 210 typically requires an odd number of clock buffers in buffer chain 208, the number of clock buffers in the clock path of clock-distribution circuit 206 may or may not be an odd number. Hence, the number of clock buffers in buffer chain 208 may include one more or one fewer clock buffer than the clock path of clock-distribution circuit 206. Also note that ring oscillator 210 does not have to be electrically coupled to clock-distribution circuit 206 within memory device 200. However, ring oscillator 210 may be located sufficiently close to clock-distribution circuit 206 so that buffer chain 208 operates in substantially the same thermal environment as clock-distribution circuit 206.

In some embodiments, the change in frequency generated by ring oscillator 210 is correlated to the timing drift in clock-distribution circuit 206. Recall that buffer chain 208 in ring oscillator 210 is a replica of the clock path. Hence, the timing drift in the clock path is also replicated in buffer chain 208 of ring oscillator 210. Because a positive/negative timing drift can lead to a reduced/increased frequency in the ring oscillator, the change in frequency of ring oscillator 210 can be used to determine the amount of timing drift in clock-distribution circuit 206.

In the embodiment illustrated in FIG. 2A, a measurement circuit 212 is used to measure the frequency generated by ring oscillator 210. More specifically, measurement circuit 212 receives an oscillating signal from ring oscillator 210 which is to be measured. Measurement circuit 212 also receives one or more control signals from a memory controller through a signaling interface, for example, control/data link 218. In one embodiment, the control signals and data can be conveyed over a common set of signal lines within control/data link 218 between the memory controller and the memory device. These control signals can include a triggering signal. After measurement circuit 212 receives the triggering signal, measurement circuit 212 can enable the oscillation of ring oscillator 210 (if it is not yet enabled). For example, this triggering signal can be used to enable a gate in a gated ring oscillator. Measurement circuit 212 can additionally use the triggering signal to initiate the frequency measurement on the output of ring oscillator 210. These operations are performed by logic within measurement circuit 212, which is described in more detail below. In one embodiment, the control signals are received by an interface receiver circuit (not shown) on memory interface 200 coupled to measurement circuit 212.

Measurement circuit 212 can also receive an instruction from the memory controller that specifies the duration of the frequency measurement. For example, in one embodiment, the controller sends both a reference clock of a known frequency (e.g., 50 MHz) and a numeral value N proportional to the planned measurement duration. In one embodiment, the known frequency of the reference clock is significantly lower than the frequency of ring oscillator 210. Note that the reference clock can be transmitted through a clock link 216 between the memory controller and memory interface 200, whereas the numeral value can be transmitted through control/data link 218.

In one embodiment, the controller uses control/data link 218 to send a read request for the measured frequency data and to receive the frequency data from measurement circuit 212. In one embodiment, control/data link 218 is a one-bit bi-directional link.

Figure 2B:
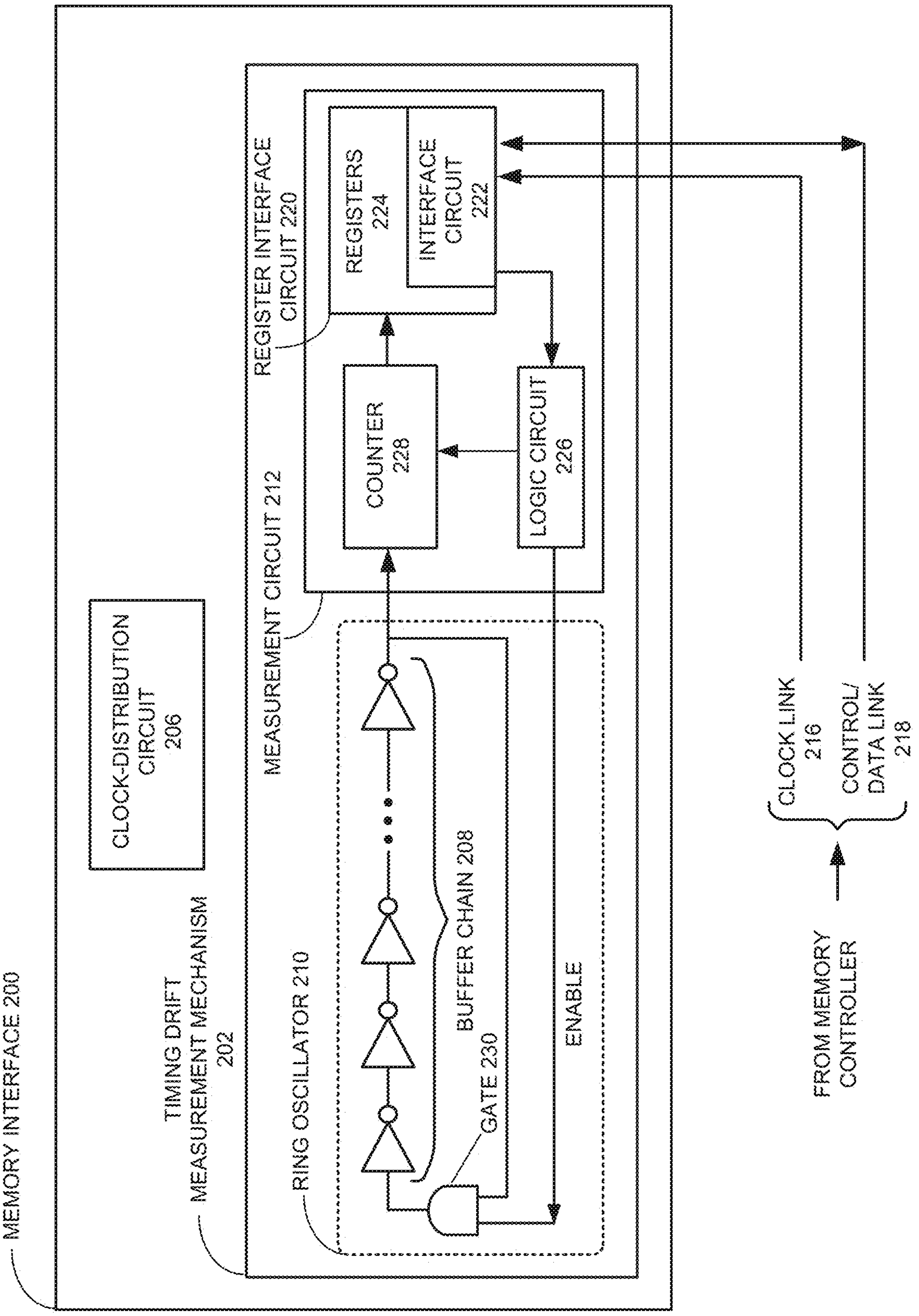
FIG. 2B illustrates a more detailed embodiment of the timing drift measurement mechanism in the memory device illustrated in FIG. 2A.

FIG. 2B illustrates a more detailed embodiment of timing drift measurement mechanism 202 in memory interface 200.

As illustrated in FIG. 2B, measurement circuit 212 includes a register interface circuit 220, which can further include an interface circuit 222 for receiving control signals from the controller and outputting measured frequency data from ring oscillator 210 to the controller. Register interface circuit 220 also includes one or more registers 224 for storing instructions received from the controller and for holding measurement results from the frequency measurement.

Measurement circuit 212 also includes a logic circuit 226, which is coupled to register interface circuit 220. Measurement circuit 212 additionally includes a counter 228, which is coupled to ring oscillator 210 as well as to both register interface circuit 220 and logic circuit 226. As shown in FIG. 2B, counter 228 receives an oscillating output from ring oscillator 210. In one embodiment, counter 228 is configured to count the edges in the oscillating output from ring oscillator 210.

In the embodiment illustrated in FIG. 2B, ring oscillator 210 also includes a gate 230 within the loop of ring oscillator 210. The loop is only closed when gate 230 is enabled, thereby activating gated ring oscillator 210. In this embodiment, logic circuit 226 provides the enable/disable signals to gate 230 to control the start/stop the oscillation of ring oscillator 210, and the beginning and end of the frequency measurement. A more detailed description of the frequency measurement operation on ring oscillator 210 is provided below.

In one embodiment, to trigger a timing drift measurement on memory interface 200, the controller (not explicitly shown) sends out a timing calibration instruction through control/data link 218 to interface circuit 222. In one embodiment, this timing calibration instruction writes a "1" to a "start" field in a register in registers 224. This operation subsequently triggers the frequency measurements. More specifically, writing into the register subsequently causes logic circuit 226 to (1) begin sending an enable signal to gate 230 in gated ring oscillator 210, thereby causing the oscillator to begin oscillation; and (2) reset counter 228. Note that these two operations can occur substantially concurrently. As a result, counter 228 begins to count the number of edges generated by gated ring oscillator 210.

Note that in addition to enabling and initiating the frequency measurement, logic circuit 226 can also control the duration of the measurement. In one embodiment, logic circuit 226 uses the received reference clock and numeral value from the controller to control the duration of the frequency measurement. For example, logic circuit 226 can include a "mini" counter controlled by the received reference clock. In one embodiment, during the frequency measurement logic circuit 226 counts a number of the reference clocks until the mini counter reaches the numeral value, and then terminates the measurement by disabling gated ring oscillator 210. Hence, the duration of the measurement equals the period of the fixed timing reference multiplied by the numeral value. Note that the state of counter 228 at the end of the measurement duration indicates the frequency of the gated ring oscillator 210. This frequency is inversely proportional to the timing delay in buffer chain 208, which is a replica of the timing delay in clock-distribution circuit 206. Furthermore, using the same measurement duration, different amounts of timing delay cause the counter value to be different during each measurement.

In one embodiment, the controller adjusts the measurement resolution by controlling the measurement duration. Because the reference clock is typically not controllable, the controller can control the measurement duration by controlling the numeral value N transmitted to the memory device. For example, using a 50 MHz reference clock and a numeral value N=20, a measurement duration is obtained as 20 ns×20=400 ns. Assuming that there is a 1 ns clock distribution delay, and 200 edges (i.e., 200 oscillator periods) from the ring oscillator are captured during the measurement duration, the measurement resolution is approximately 1%. However, by increasing the numeral value N, more edges can be captured and the measurement resolution can be increased proportional to the numeral value N.

In some embodiments, the measurement duration (e.g., the value of N) for each new measurement and the measurement frequency on a memory device can be determined adaptively based on a degree of the timing drift occurring on the memory device. For example, if the controller detects a fast timing drift in a memory device, the controller can issue a shorter measurement duration to the memory device to collect fewer edges for the new measurement. In contrast, if the controller detects a slow timing drift, then the controller can issue a longer measurement duration to collect more edges for the new measurement. Furthermore, if the controller detects that the measured frequency of the ring oscillator and hence the timing delay stays the same during recent measurements, the controller can increase the measurement interval. On the other hand, if the controller detects that the measured frequency of the ring oscillator, and hence the timing delay starts to change, the controller can decrease the measurement interval to pool the frequency value of the ring oscillator more often. We describe a more detailed embodiment of adaptively controlling the measurement interval below.

The state of counter 228 at the end of the measurement duration can then be stored in a register of registers 224. This operation can be triggered by logic circuit 226 at the end of the measurement through couplings between counter 228 and logic circuit 226. Next, the controller can read back the counter state from registers 224 through interface circuit 222, and can subsequently perform timing drift adjustment accordingly.

In one embodiment, to determine the timing drift based on the state of counter 228, the controller first computes a frequency change Δf, which is the difference between two consecutive measured frequencies. Next, the controller convert the frequency change Δf into a corresponding timing drift Δt.

Figure 3:
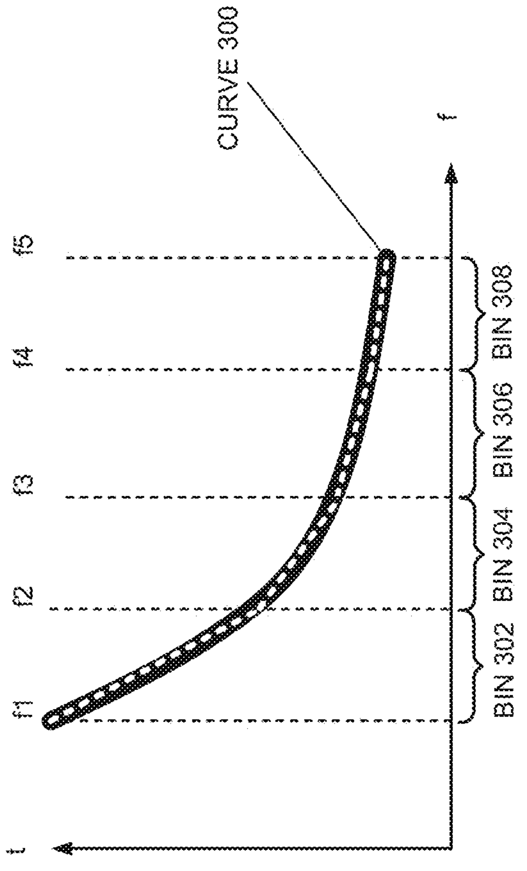
FIG. 3 illustrates an exemplary frequency (f) vs. timing drift (1) curve.

Typically, the timing drift Δt is inversely proportional to the corresponding frequency change Δf. This relationship may be predetermined by generating a frequency (f) vs. timing drift (1) curve for memory interface 200. However, this relationship is generally non-linear, and depends on the value of the measured frequency f. For example, FIG. 3 illustrates an exemplary frequency (f) vs. timing drift (1) curve 300 (i.e., the thick black curve). This non-linear relationship indicates that, in order to determine a timing drift Δt corresponding to a frequency change Δf, a large look-up table is required to be available to the controller.

In one embodiment, to simplify the Δf-to-Δt conversion, circuitry or software running in the controller device can modify the actual non-linear curve 300 into a piece-wise-linearized frequency vs. timing drift curve. More specifically, curve 300 can be divided into a number of "zones," wherein each zone corresponds to a smaller frequency bin within which the frequency vs. timing drift curve can be approximated as linear. For example, curve 300 is divided into four frequency bins 302-308 by a set of boundary frequencies f1 to f5; within each bin, a straight line (white dashed line) connecting a pair of boundary frequencies is used to approximate the non-linear curve 300. Note that the frequency bins do not have to be the same size.

Each bin can be described by a constant slope of the straight line approximating the original curve 300. Hence, to convert Δf to Δt at any location between f1 and f5, the controller first determines which frequency bin the measurement frequency falls into. This can be achieved by using comparators to compare the measured frequency f (based on the counter state) with the boundary frequencies of each frequency bin. After determining the correct frequency bin, the conversion simply involves multiplying the slope of the straight line approximation for the bin by the frequency change Δf for the measured frequency.

While FIGS. 2A and 2B describe performing timing drift measurements on a single memory device, some embodiments perform parallel timing drift measurements for a set of memory devices (both active and non-active devices), such as memory devices 104 in FIG. 1. In these embodiments, it is assumed that each memory device in the set of memory devices possesses a measurement circuit similar to measurement circuit 212 described in FIGS. 2A and 2B. During operation, a controller can transmit a broadcast write instruction to the set of memory devices through their respective register interface circuits, thereby triggering independent frequency measurements on each memory device in the set of memory devices as was described above. Δt the end of these measurements, the state of the counter of the measurement circuit is stored in a respective register in the respective register interface circuit. In one embodiment, the controller can perform a sequential register read-back of the counter data from the set of memory devices.

For example, for a memory system which uses register interface clock running at 50 MHz and a 32-bit register interface serial packet (0.64 us per packet), one broadcast packet can be used to start the measurements on a set of memory devices, and one read packet per device can be used to read back drift measurement data. In this configuration, the system can perform drift measurements of up to 16 devices within about 10 μs, which provides sufficient measurement bandwidth for temperature drift time constants up to a few degC/ms.

Note that, for memory systems performing periodic timing drift calibration (PCAL), the PCAL period is typically determined based on the worst-case timing-drift-rate. This means that periodic calibration is often performed more frequently than necessary. However, a short PCAL period often leads to loss of bandwidth in active memory access, because the controller has to interrupt memory traffic more often to do the calibration. Furthermore, a short PCAL period can also cause power increase in a low-power state of a memory device because the controller has to wake up the idle link to do the calibration.

Figure 4:
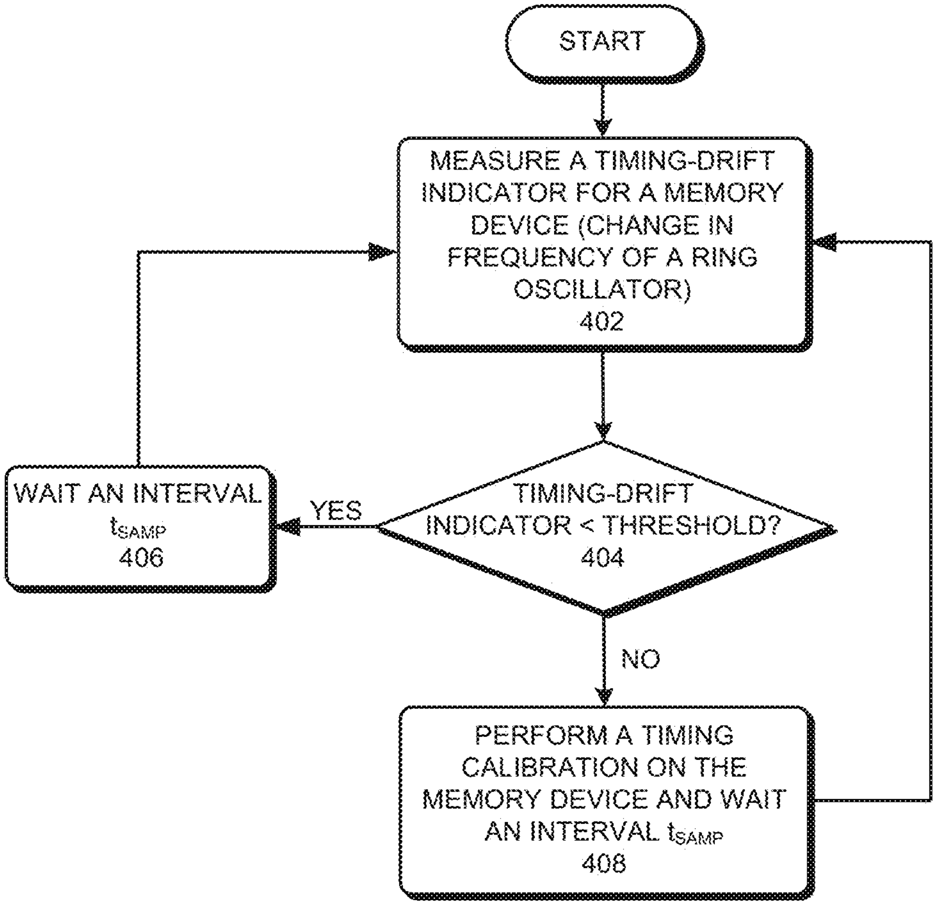
FIG. 4 presents a flowchart illustrating a process of dynamically determining a timing calibration interval for a memory device in a memory system.

In some embodiments, the PCAL period can be determined dynamically for each memory device. For example, some embodiments perform period calibration only when the timing drift is determined to be sufficiently large. FIG. 4 presents a flowchart illustrating a process of dynamically determining a timing calibration interval for a memory device using a memory controller in a memory system.

During operation, the memory controller periodically measures a timing-drift indicator for the memory device (step 402). More specifically, the memory controller periodically measures the frequency drift of a ring oscillator within the memory device as the timing-drift indicator for the memory device. This technique has been described in detail in conjunction with FIGS. 2A and 2B. Note that the memory controller can perform the timing-drift indicator measurement using either a register interface link or a regular command channel between a memory controller and the memory device being measured.

After each measurement, the memory controller compares the measured timing-drift indicator with a threshold value, and subsequently determines if the measured timing-drift indicator is less than the threshold value (step 404). If so, the memory controller determines that the timing drift is not sufficiently large to necessitate a timing calibration (step 406). After waiting a predetermined interval $t_{SAMP}$, the memory controller returns to step 402 to perform the next measurement of the timing-drift indicator on the memory device.

However, if the measured timing-drift indicator is greater than the threshold value at step 404, the memory controller determines that the timing drift is sufficiently large and subsequently performs a timing calibration on the memory device (step 408). After performing the timing calibration, and after waiting the predetermined interval $t_{SAMP}$, the memory controller returns to step 402 to perform the next measurement of the timing-drift indicator on the memory device.

Note that the technique illustrated in FIG. 4 dynamically determines an interval between two consecutive timing calibrations based on the value of a timing-drift indicator. Because the power and link-down-times required to perform the timing-drift indicator measurements are typically much shorter than the time required to performing periodic timing calibration, the interval between two consecutive drift-measurements ($t_{SAMP}$) can also be adaptively adjusted. For example, $t_{SAMP}$ can be decreased to provide better measurement resolution if rate of timing-drift is determined to be high. On the other hand, $t_{SAMP}$ can be increased to avoid unnecessary register accesses if the rate of timing-drift is determined to be low.

The above-described techniques and apparatus can be used in different systems employing different types of integrated circuit devices including memory devices and memory controllers that control the operation of these memory devices. Examples of these systems include, but are not limited to, mobile systems, desktop computers, servers, and/or graphics applications. The memory devices can include dynamic random access memory (DRAM). Moreover, the DRAM may be, e.g., graphics double data rate (GDDR, GDDR2, GDDR3, GDDR4, GDDR5, and future generations), double data rate (DDR2, DDR3 and future memory types), and low-power double data rate (LPDDR2 and future generations)

The techniques and apparatus described may be applicable to other types of memory or integrated circuit devices, for example, system on chip ("SoC") implementations, flash and other types of non-volatile memory and static random access memory (SRAM).

Figure 5:
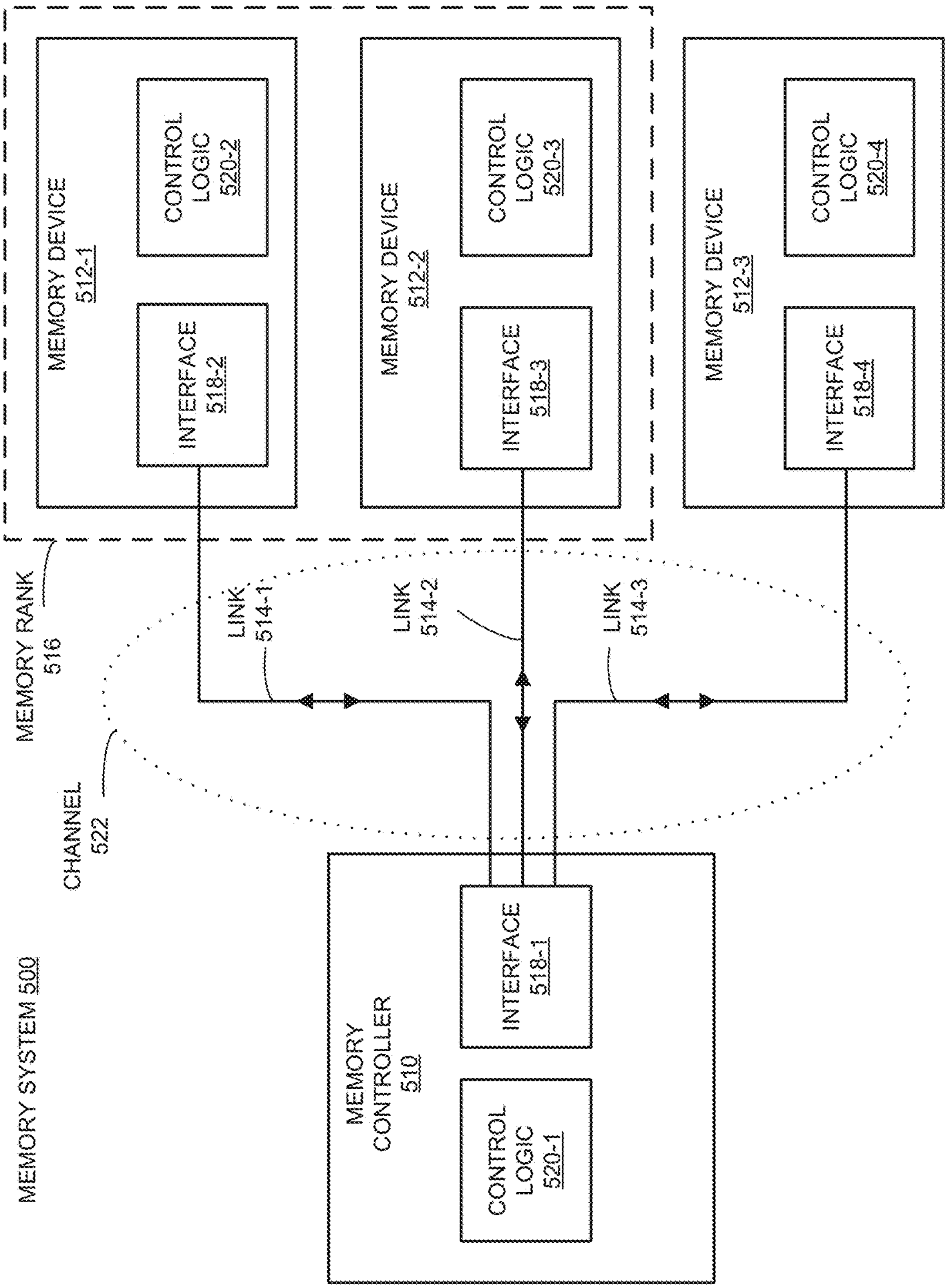
FIG. 5 presents a block diagram illustrating an embodiment of a memory system, which includes at least one memory controller and one or more memory devices.

Additional embodiments of memory systems that may use one or more of the above-described apparatus and techniques are described below with reference to FIG. 5. FIG. 5 presents a block diagram illustrating an embodiment of a memory system 500, which includes at least one memory controller 510 and one or more memory devices 512. While FIG. 5 illustrates memory system 500 with one memory controller 510 and three memory devices 512, other embodiments may have additional memory controllers and fewer or more memory devices 512. Note that the one or more integrated circuits may be included in a single chip-package, e.g., in a stacked configuration.

In some embodiments, memory controller 510 is a local memory controller (such as a DRAM memory controller) and/or is a system memory controller (which may be implemented in a microprocessor, an application-specific integrated circuit (ASIC), a system-on-a-chip (SoC) or a field-programmable gate array (FPGA)).

Memory controller 510 may include an I/O interface 518-1 and control logic 520-1. In some embodiments, one or more of memory devices 512 include control logic 520 and at least one of interfaces 518. However, in some embodiments some of the memory devices 512 may not have control logic 520. Moreover, memory controller 510 and/or one or more of memory devices 512 may include more than one of the interfaces 518, and these interfaces may share one or more control logic 520 circuits. In some embodiments two or more of the memory devices 512, such as memory devices 512-1 and 512-2, may be configured as a memory rank 516.

As discussed in conjunction with FIGS. 2A, 2B, 5 and 6, one or more of control logic 520-1, control logic 520-2, control logic 520-3, and control logic 520-4 may be used to control frequency or temperature measurements on memory devices 512 to determine timing drift within these memory devices. Memory controller 510 may use a measured frequency from a memory device to determine the timing drift in the memory device. Memory controller 510 can also use a measured frequency or temperature from a memory device to determine the degree of the timing drift in the memory device and subsequently decide whether to initiate a timing calibration on the memory device.

Memory controller 510 and memory devices 512 are coupled by one or more links 514, such as multiple wires, in a channel 522. While memory system 500 is illustrated as having three links 514, other embodiments may have fewer or more links 514. Furthermore, links 514 may be used for bi-directional and/or unidirectional communication between the memory controller 510 and one or more of the memory devices 512. For example, bi-directional communication between the memory controller 510 and a given memory device may be simultaneous (full-duplex communication). Alternatively, the memory controller 510 may transmit a command to the given memory device, and the given memory device may subsequently provide requested data to the memory controller 510, e.g., a communication direction on one or more of the links 514 may alternate (half-duplex communication). Also, one or more of the links 514 and corresponding transmit circuits and/or receive circuits may be dynamically configured, for example, by one of the control logic 520 circuits, for bidirectional and/or unidirectional communication.

Signals corresponding to data and/or commands (such as request-for-data commands) may be communicated on one or more of the links 514 using either or both edges in one or more timing signals. These timing signals may be generated based on one or more clock signals, which may be generated on-chip (for example, using a phase-locked loop and one or more reference signals provided by a frequency reference) and/or off-chip.

In some embodiments, commands are communicated from the memory controller 510 to one or more of the memory devices 512 using a separate command link, i.e., using a subset of the links 514 which communicate commands. However, in some embodiments commands are communicated using the same portion of the channel 522 (i.e., the same links 514) as data.

Devices and circuits described herein may be implemented using computer-aided design tools available in the art, and embodied by computer-readable files containing software descriptions of such circuits. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

The preceding description was presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein. Accordingly, many modifications and variations will be apparent to practitioners skilled in the art. Additionally, the above disclosure is not intended to limit the present description. The scope of the present description is defined by the appended claims.

Also, some of the above-described methods and processes can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware. For example, the hardware can include, but are not limited to, application-specific integrated circuit (ASIC) chips, field-programmable gate arrays (FPGAs), and other programmable-logic devices now known or later developed. When the hardware is activated, the hardware performs the methods and processes included within the hardware.

What is claimed is:

1. A dynamic random access memory device (DRAM) chip comprising:

a memory array comprising a plurality of memory cells;

a clock distribution circuit to distribute a clock signal to a data signaling interface circuit;

an oscillator circuit to generate an oscillating signal, the oscillator circuit comprising a replica portion of the clock distribution circuit;

a counter, coupled to the oscillator circuit, to count a number of cycles of the oscillating signal that occur during a time interval;

a register to store a digital value representative of the cycle count; and the data signaling interface to output the digital value in response to a register read command.

2. The DRAM chip of claim 1, wherein the counter is to begin the count in response to a first register command.

3. The DRAM chip of claim 1, wherein the signaling interface is to receive commands from a controller chip, the commands comprising a first register command and a second register command, the first register command comprising a write to a first register of a plurality of registers.

4. The DRAM chip of claim 3, wherein the signaling interface is to receive a third command to trigger an end of the time interval.

5. The DRAM chip of claim 1, wherein the oscillator circuit comprises a ring oscillator having an output to provide the oscillating signal.

6. The DRAM chip of claim 5, wherein the counter is to count the number of cycles of the oscillating signal by counting edges of the output of the ring oscillator.

7. The DRAM chip of claim 1, wherein the replica portion of the clock distribution circuit comprises a replica buffer chain.

8. The DRAM chip of claim 1, wherein the time interval comprises a measurement duration period.

9. A method comprising:

distributing, by a clock distribution circuit of a dynamic random access memory device (DRAM) chip, a clock signal to a data signaling interface circuit;

generating, by an oscillator circuit comprising a replication portion of the clock distribution circuit, an oscillating signal;

determining, by a counter coupled to the oscillator circuit, a number of cycles of the oscillating signal that occur during a time interval;

storing, in a register, a digital value representative of the number of cycles; and outputting, by the data signaling interface circuit, the digital value in response to a register read command.

10. The method of claim 9, wherein the counter is to begin determining the number of cycles in response to a first register command.

11. The method of claim 9, further comprising:

receiving, by the data signaling interface circuit, commands from a controller chip, the commands comprising a first register command and a second register command, the first register command comprising a write to a first register of a plurality of registers.

12. The method of claim 11, further comprising:

receiving, by the data signaling interface circuit, a third command to trigger an end of the time interval.

13. The method of claim 9, wherein the oscillator circuit comprises a ring oscillator having an output to provide the oscillating signal.

14. The method of claim 13, wherein determining the number of cycles of the oscillating signal comprises counting edges of the output of the ring oscillator.

15. The method of claim 9, wherein the replica portion of the clock distribution circuit comprises a replica buffer chain.

16. The method of claim 9, wherein the time interval comprises a measurement duration period.

17. A dynamic random access memory device (DRAM) chip comprising:

an oscillator circuit to generate an oscillating signal, the oscillator circuit comprising a replica portion of a clock distribution circuit;

a counter, coupled to the oscillator circuit, to count a number of cycles of the oscillating signal that occur during a time interval;

a register to store a digital value representative of the cycle count; and a data signaling interface to output the digital value in response to a register read command.

18. The DRAM chip of claim 17, wherein the oscillator circuit comprises a ring oscillator having an output to provide the oscillating signal.

19. The DRAM chip of claim 18, wherein the counter is to count the number of cycles of the oscillating signal by counting edges of the output of the ring oscillator.

20. The DRAM chip of claim 17, wherein the replica portion of the clock distribution circuit comprises a replica buffer chain.

* * * * *